United States Patent
Takahashi et al.

[11] Patent Number: 5,706,294
[45] Date of Patent: Jan. 6, 1998

[54] METHOD OF FINDING DC TEST POINT OF AN INTEGRATED CIRCUIT

[75] Inventors: Toshihiro Takahashi, Osaka; Toshiya Murota, Kawanishi; Naohiko Nishigaki, Osaka, all of Japan

[73] Assignee: Ricoh Company, Ltd., Tokyo, Japan

[21] Appl. No.: 670,367

[22] Filed: Jun. 25, 1996

[30] Foreign Application Priority Data

Jul. 4, 1995 [JP] Japan .................. 7-169006

[51] Int. Cl.$^6$ .................. G01R 31/28
[52] U.S. Cl. .................. 371/22.1; 364/483; 324/765
[58] Field of Search .................. 371/22.1, 25.1, 371/27, 28; 364/200, 900, 483, 489, 550; 324/158 R, 158.1, 73.1, 765; 395/183.13

[56] References Cited

U.S. PATENT DOCUMENTS

| | | | |
|---|---|---|---|
| 4,045,736 | 8/1977 | Carpenter et al. | 324/158 R |
| 4,313,200 | 1/1982 | Nishiura | 371/25 |
| 4,903,267 | 2/1990 | Arai et al. | 371/27 |
| 5,389,990 | 2/1995 | Nakamura | 324/158.1 |
| 5,400,263 | 3/1995 | Rohrbaugh et al. | 364/490 |
| 5,410,247 | 4/1995 | Isizuka | 324/158.1 |

FOREIGN PATENT DOCUMENTS 4-291179  10/1992  Japan.

Primary Examiner—Robert W. Beausoliel, Jr.
Assistant Examiner—Nadeem Iqbal
Attorney, Agent, or Firm—Cooper & Dunham LLP

[57] ABSTRACT

A DC test point finding method includes steps of: displaying a list of all input and output terminals of an integrated circuit; inputting selected terminals among the terminals of the list; inputting a selected test pattern file among a number of stored test pattern files, each test pattern file including a plurality of sequentially occurred test vectors and identified by a name of the test pattern file, the test vectors identified by respective vector numbers; inputting a test point finding condition related to a DC test point; finding the DC test point of the circuit among the selected terminals by using the test vectors of the selected test pattern file and the test point finding condition; and inserting test point data of the DC test point into the list so that the resulting list including the test point data is displayed.

8 Claims, 3 Drawing Sheets

F I G. 1
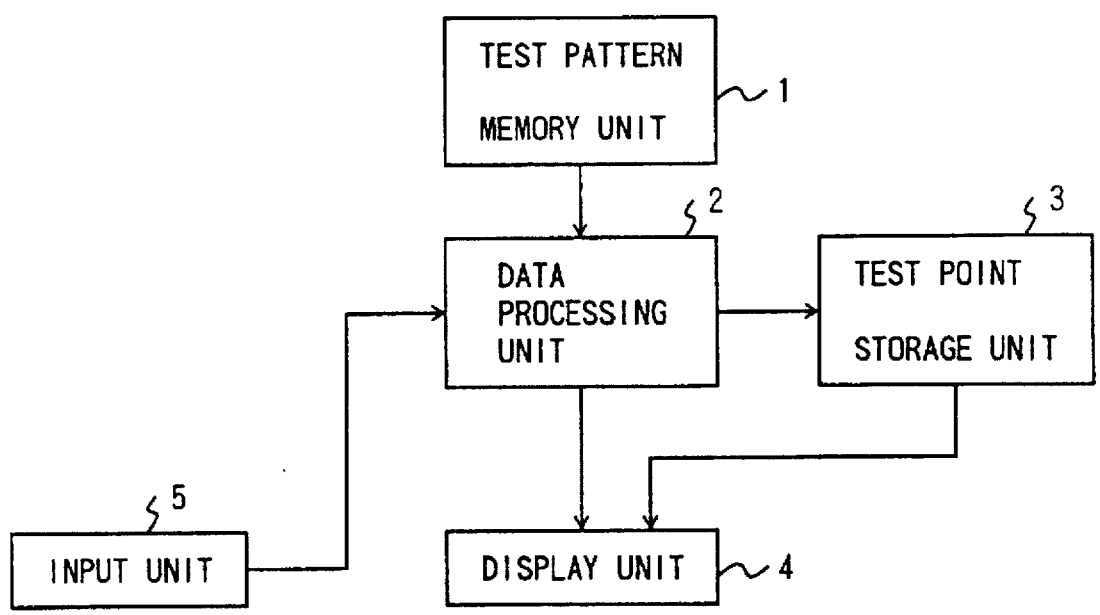

METHOD OF FINDING DC TEST POINT OF AN INTEGRATED CIRCUIT

BACKGROUND OF THE INVENTION

(1) Field of the Invention

The present invention relates to a method of finding a DC test point of an integrated circuit from among a plurality of input and output terminals of the circuit, and a special test vector of a test pattern being suitably applied to the DC test point of the circuit during a DC test.

(2) Description of the Related Art

Generally, function tests of large-scaled integrated (LSI) circuits, for example, complementary metal oxide semiconductor (CMOS) integrated circuits, are performed to detect whether functional operations of the circuits are suitable. However, in order to check all the design specifications including direct-current (DC) characteristics, the function tests are insufficient.

In order to detect whether the DC characteristics of an LSI circuit are suitable for the design specifications, performing a direct-current (DC) test is needed. For example, the DC test is performed to detect whether current values and/or voltage values measured at the input and output terminals of the circuit when the terminals of the circuit are set at desired internal states are within a range of DC current/voltage characteristics according to the design specifications. In order to set the terminals of the circuit at the desired internal states during the DC test, it is necessary to apply a suitable test pattern to the input terminals of the circuit.

The DC test includes a number of test items which are checked during the DC test. For example, a VOH test is one of the test items of the DC test. The VOH test is performed to detect whether a voltage value measured at a digital output terminal of the circuit when the output terminal is set at a logical "High" state of the output voltage is above a required voltage level. Therefore, when the VOH test is performed, it is necessary to apply to the input terminals of the circuit a suitable test vector of a DC test pattern which sets the output terminal at the logical "High" state of the output voltage. Therefore, it is necessary to provide a method of finding a special test vector, which is suitable for the DC test (e.g. the VOH test), from among a plurality of sequentially occurred test vectors of the test pattern.

The conventional methods which are similar to the above-mentioned method of finding such a test vector of a DC test pattern may be classified into the following three kinds.

Hereinafter, the DC test pattern will be referred to as a test pattern file including a plurality of sequentially-occurred test vectors which are applied to input terminals of an LSI circuit. The DC test point will be referred to as the special test vector among the test vectors of the DC test pattern, which is suitably applied to a specified terminal of the circuit. Data of the DC test point includes an identification of the test pattern file and a vector number identifying the special test vector among the sequentially occurred test vectors of the test pattern file.

The first-kind method mentioned above is a classic method which finds a DC test point by using an LSI tester. An LSI circuit which is subjected to the DC test is set on the LSI tester. A number of test vectors is selected by trial and error from among all test vectors of a function test pattern stored within the LSI tester. When the first-kind method is performed, it must be detected whether each selected test vector is suitable for the DC test by repeating the trial and error.

When the trial and error procedures of the above first-kind method are performed, a very large amount of time and labor is required for a testing operator to find the special test vector from all the test vectors of the function test pattern. It is difficult for the first-kind method to efficiently find the special test vector, when the circuit includes a large number of input and output terminals.

The second-kind method mentioned above is a conventional method which finds a DC test point by using an improved integrated circuit including a test-mode circuit for facilitating the DC test. An example of the second-kind method is disclosed in Japanese Laid-Open Patent Application No. 4-291179. When a DC test instruction is input to the improved integrated circuit, the connection to a main processing circuit is switched off and the test-mode circuit is operated in accordance with simple procedures to set the input and output terminals of the circuit at desired internal states. The DC test for the circuit is then performed.

The circuit which is efficiently tested by performing the second-kind method is limited. If a certain integrated circuit is suitably tested by the second-kind method, it is possible to efficiently find the DC test point of the circuit. However, the improved integrated circuit used by the second-kind method must include the test-mode circuit for the DC test. The cost of the entire circuit becomes high, and the operating speed of the integrated circuit becomes low. Further, it is not always easy to utilize the second-kind method for all kinds of integrated circuits.

The third-kind method mentioned above is a method of automatically finding a DC test point by using a function test pattern in accordance with a certain criterion, a special test vector of the test point being selected from among the test vectors of the function test pattern. A DC test point finding apparatus may be utilized to select the special test vector by the third-kind method.

However, when the above third-kind method is used, there are the following problems.

1. The finding of the DC test point is performed in a fixed manner in which the same test pattern is applied to all the input terminals of the circuit. However, practically, there is a case in which using a first test pattern is desired for the finding of a DC test point for a terminal A and using a second test pattern is desired for the finding of a DC test point for a terminal B. It is impossible for the above third-kind method to provide a flexibility of the finding of the test point in such a case.

2. When no DC test point for the circuit is found after the finding is performed, the result of the finding is not easily observed by the operator. Even if the operator observes the result of the finding, it is difficult for the operator to take measures against the failure of the finding. Further, when the third-kind method is performed, the finding of the DC test point is not always successfully done by using a predetermined test pattern. The above third-kind method does not allow the operator to easily detect whether the result of the finding is successful.

3. Some LSI circuits include exclusion terminals which should be excluded from the terminals of the circuit subjected to the finding of a test point suitable for a specific test item of the DC test. For example, the VOH test should be performed only for digital output terminals of the circuit and is not required for analog output terminals of the circuit. Searching for a DC test point for the analog output terminals as well as for the digital output terminals, as in the above third-kind method, requires additional processing time.

As described above, in the case of the third-kind method, the finding of the DC test point is done by applying the same test pattern to all the input and output terminals of the circuit. Therefore, the third-kind method does not provide a flexibility of the finding of the DC test point for applying different test patterns and for inputting selected terminals of the circuit. Further, the third-kind method does not provide a capability of notifying the result of the finding to the operator. It is also difficult to efficiently find the DC test point when the third-kind method is performed.

SUMMARY OF THE INVENTION

An object of the present invention is to provide an improved DC test point finding method in which the above-described problems are eliminated.

Another object of the present invention is to provide a DC test point finding method which quickly and efficiently finds a DC test point of an integrated circuit from among a plurality of input and output terminals of the circuit, and a special test vector of a selected test pattern being suitably applied to the DC test point of the circuit during a DC test.

The above-mentioned objects of the present invention are achieved by a DC test point finding method which includes steps of: displaying a list of all input and output terminals of an integrated circuit, the list including respective terminal names of all the input and output terminals; inputting selected terminals among the input and output terminals of the displayed list; inputting a selected test pattern file among a number of stored test pattern files, each stored test pattern file including a plurality of sequentially occurred test vectors and identified by a name of the test pattern file, the test vectors identified by respective vector numbers; inputting a test point finding condition related to a DC test point; finding the DC test point of the circuit among the selected terminals by using the test vectors of the selected test pattern file and the input test point finding condition; and inserting test point data of the found DC test point into the displayed list so that the resulting list including the test point data is displayed.

The DC test point finding method of the present invention efficiently finds the DC test point of the integrated circuit. It is possible for the DC test point finding method to provide a flexibility of the finding of the DC test point for applying different test patterns and for inputting selected terminals of the circuit. Further, it is possible for the DC test point finding method of the present invention to provide a capability of notifying the result of the finding of the DC test point to the operator. Further, it is possible for the DC test point finding method of the present invention to provide a capability of omitting the terminals which should be excluded from the terminals of the circuit which are tested regarding a specific test item of the DC test.

BRIEF DESCRIPTION OF THE DRAWINGS

Other objects, features and advantages of the present invention will become more apparent from the following detailed description when read in conjunction with the accompanying drawings in which:

FIG. 1 is a block diagram of a system which performs steps of a DC test point finding method in one embodiment of the present invention.

DETAILED DESCRIPTION OF THE PREFERRED EMBODIMENT

Figure 2A:
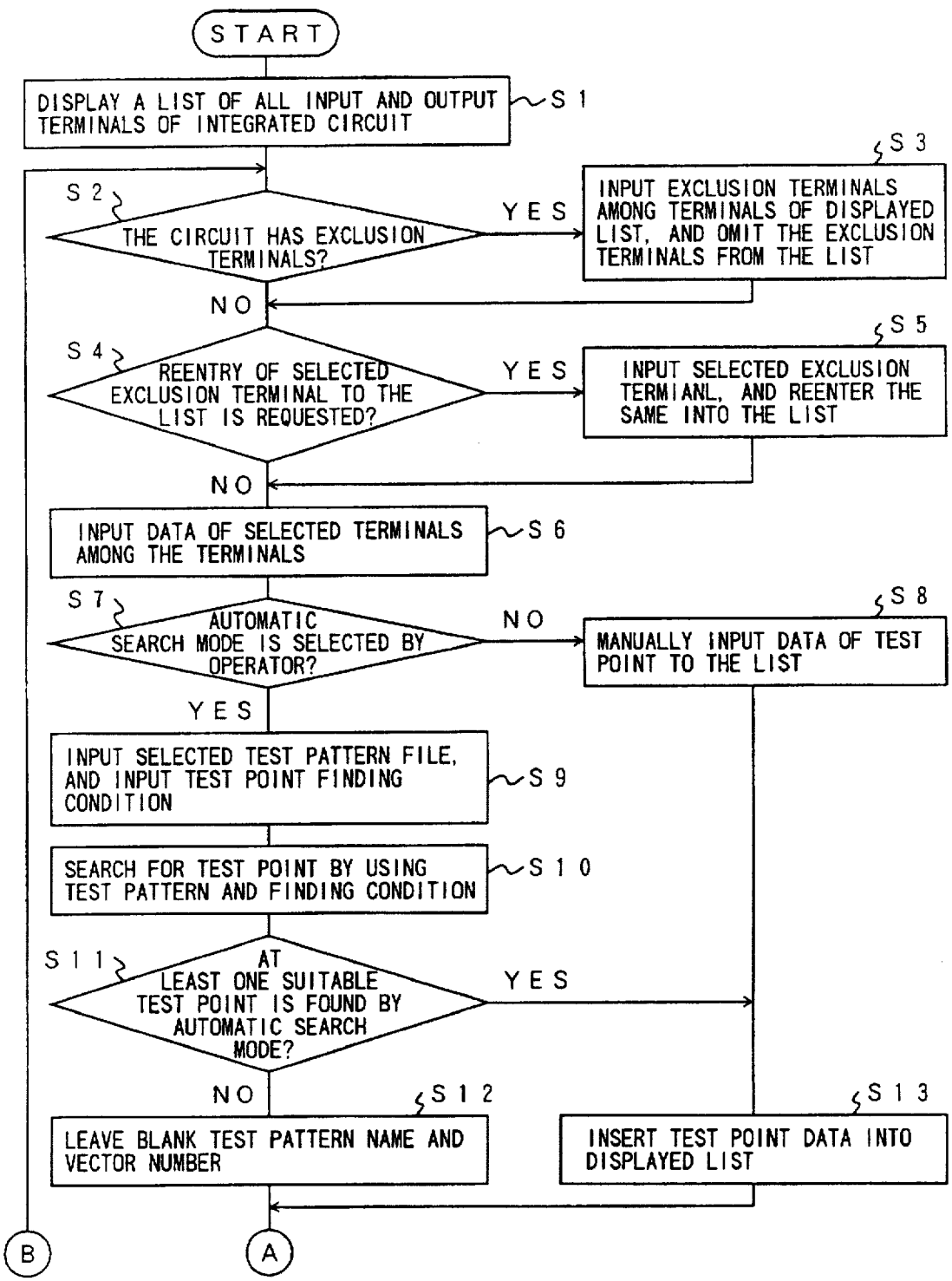
FIGS. 2A and 2B are a flowchart for explaining the steps of the DC test point finding method of the above embodiment.

A description will now be given of the preferred embodiment of the present invention with reference to the accompanying drawings.

FIG. 1 shows a DC test point finding system which performs the steps of a DC test point finding method in one embodiment of the present invention.

Referring to FIG. 1, the DC test point finding system includes a test pattern memory unit 1, a data processing unit 2, a test point storage unit 3, a display unit 4, and an input unit 5.

A large-scaled integrated (LSI) circuit which is subjected to the DC test point finding method of the present invention includes a plurality of input and output terminals. A DC test for the circuit is performed to detect whether DC characteristics of the input and output terminals of the circuit when the terminals of the circuit are set at the desired internal states are suitable for the design specifications.

The test pattern memory unit 1 is a memory device coupled to the data processing unit 2. Generally, a number of test pattern files are stored in the test pattern memory device. In the present embodiment, at least one test pattern file, used for a function test of the circuit, is stored in the test pattern memory unit 1. A test pattern of the stored test pattern file is transferred to the data processing unit 2.

As described above, the test pattern of the stored test pattern file includes a plurality of sequentially-occurred test vectors which are applied to the input terminals of the circuit.

The input unit 5 is an inputting device which is used by the operator to input respective terminal names of the input and output terminals of the circuit as well as to input a test point finding condition. The input data from the input unit 5 is transferred to the data processing unit 2. The input unit 5 in the present embodiment is, for example, a keyboard or mouse of a computer system.

The data processing unit 2 is a central processing unit of the computer system which searches for a DC test point among a number of selected terminals of the circuit in accordance with the sequentially occurred test vectors of a test pattern from the test pattern memory unit 1.

The data processing unit 2 detects whether the DC test point of the circuit is suitable for the DC test in accordance with the test point finding condition from the input unit 5. If it is detected that the DC test point is suitable for the DC test, the data processing unit 2 generates test point data of the DC test point. The test point data from the data processing unit 2 includes an identification of the test pattern file and a vector number identifying the special test vector among the test vectors of the test pattern.

The test point storage unit 3 is a memory device in which the test point data from the data processing unit 2 is stored. The test point data stored in the test point storage unit 3 may be transferred to the display unit 4 so that the test point data is displayed on the display unit 4. Alternatively, the test point data stored in the test point storage unit 3 may be transferred to a printing device (not shown) so that the test point data is printed by the printing device.

The display unit 4 is an output device which provides information regarding the DC test to the operator in a visual formation. On the display unit 4, the test point data from the data processing unit 2 in a visual formation is displayed, so that the operator can view the test point data. The display unit 4 in the present embodiment is, for example, a displaying device or a printer device.

Next, a description will be given of steps of the DC test point finding method in the embodiment of the present invention.

Figure 2B:
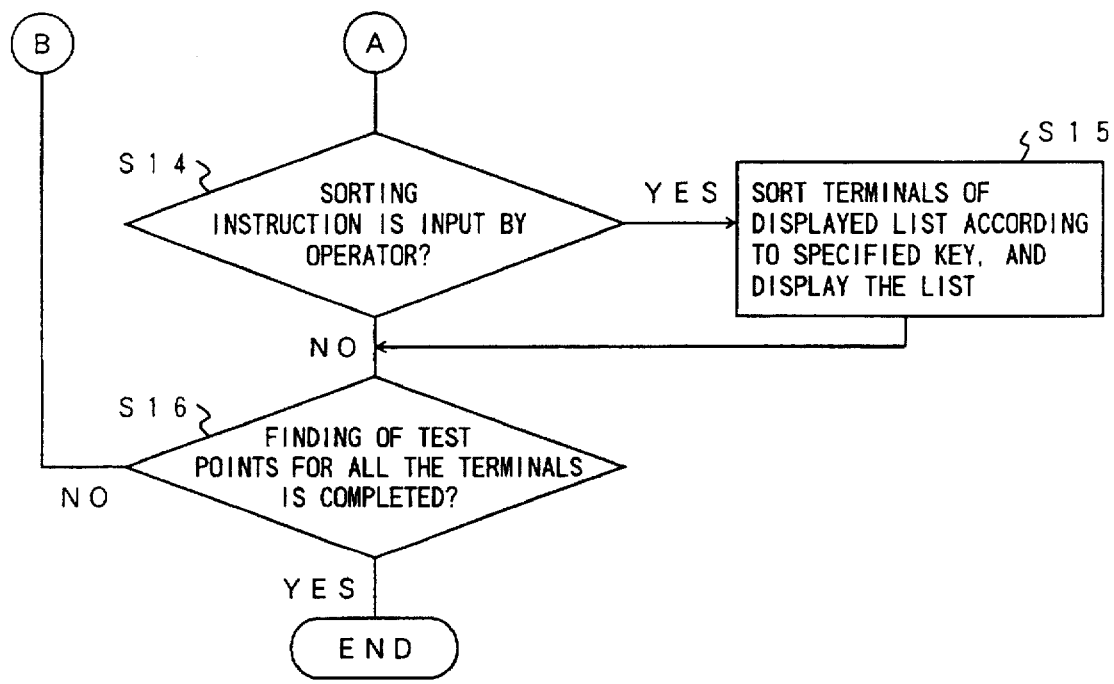

FIGS. 2A and 2B show the steps of the DC test point finding method of the above embodiment of the present invention. FIG. 2A and FIG. 2B are a flowchart of the DC test point finding method which is divided into two parts for the sake of convenience. The two parts of the flowchart are interconnected by characters "A" and "B" as in FIGS. 2A and 2B.

The DC test point finding method of the present invention finds at least one DC test point among the input and output terminals of the circuit, and a special test vector of a selected test pattern is suitably applied to the test point of the circuit during a DC test.

Referring to FIG. 2A, step S1 displays a list of all the input and output terminals of the circuit identified by respective terminal names. The displayed list includes the respective terminal names of all the input and output terminals of the circuit.

In the present embodiment, the terminal names of all the input and output terminals of the circuit are input to the data processing unit 2 by the operator by using the input unit 5. The list displayed at this time on the display unit 4 includes the terminal names of all the input and output terminals.

The list including the terminal names of the input and output terminals of the circuit only is produced by the data processing unit 2 of the DC test point finding system, and the list is displayed on the display unit 4 as shown in TABLE 1 below.

TABLE 1

| LIST | | |
|---|---|---|
| INPUT/OUTPUT TERMINALS | NAME OF TEST PATTERN | VECTOR NO. |
| PIN 1 | | |
| PIN 2 | | |
| PIN 3 | | |
| PIN 4 | | |

As shown in the above TABLE 1, the name of test pattern file and the vector number of the special test vector for each of the terminals in the displayed list are left blank at the step S1.

Step S2 detects whether the circuit includes exclusion terminals which should be excluded from the input and output terminals of the circuit which are subjected to the finding of the DC test point.

The exclusion terminals of the circuit, if any, are selected by the operator, and the names of the selected exclusion terminals are input to the data processing unit 2 by the operator by using the input unit 5. For example, analog output terminals of the circuit are the exclusion terminals in the case of the VOH test. The VOH test is performed for digital output terminals of the circuit, and performing the VOH test for the analog output terminals of the circuit is not required.

If the result at the step S2 is affirmative, step S3 is performed. The step S3 allows the operator to input the exclusion terminals among the input and output terminals of the displayed list. The exclusion terminals are omitted by the data processing unit 2 from the displayed list, and only the remaining terminals of the displayed list are subjected to the finding of the test point.

If the result at the step S2 is negative, the step S3 is not performed.

Step S4 detects whether a reentry of a selected exclusion terminal among the omitted exclusion terminals to the displayed list is requested by the operator. The selected exclusion terminal, if any, is reentered to the displayed list by the data processing unit 2. For example, when a terminal which should not be excluded is erroneously input by the operator as the exclusion terminal at the step S3, the reentry of such a terminal to the list is requested by the operator.

If the result at the step S4 is affirmative, step S5 is performed. The step S5 allows the operator to input the selected exclusion terminal among the omitted exclusion terminals. The selected exclusion terminal, previously omitted at the step S3 and input at the step S5, is reentered to the displayed list by the data processing unit 2.

If the result at the step S4 is negative, the step S5 is not performed.

Step S6 allows the operator to input the terminal names of selected terminals among the input and output terminals of the displayed list. In the present embodiment, the selected terminals at this step are subjected to the finding of the DC test point, and the non-selected terminals of the displayed list are not subjected to the finding of the DC test point.

The above DC test point finding system can be operated in one of an automatic search mode and a manual search mode in order to carry out the finding of the DC test point. One of the automatic search mode and the manual search mode is selected by the operator.

Step S7 detects whether the automatic search mode is selected by the operator.

If the result at the step S7 is negative, it is determined that the manual search mode of the DC test point finding system is selected by the operator. Step S8 allows the operator to manually input specific data of a DC test point into the displayed list. The resulting list including the specific data of the DC test point is displayed by the data processing unit 2.

If the result at the step S7 is affirmative, step S9 is performed. The step S9 allows the operator to input a selected test pattern file among the test pattern files stored in the test pattern memory unit 1, each stored test pattern file including a plurality of sequentially occurred test vectors and identified by a name of the test pattern file, and the test vectors being identified by respective vector numbers. Therefore, the selected test pattern file, input at the step S9, also includes the sequentially occurred test vectors and is identified by the name of the selected test pattern file, and the test vectors are identified by the vector numbers.

Further, the step S9 allows the operator to input a test point finding condition related to the DC test point. The test point finding condition is information indicating what DC characteristics of the terminals are required for the DC test point. For example, in the case of the VOH test, the test point finding condition means the information indicating that the output voltage of the DC test point is the logical "High" state.

Step S10 searches for the DC test point of the circuit among the selected terminals by using the test vectors of the selected test pattern file and the input test point finding condition. At the step S10, the data processing unit 2 reads out the selected test pattern file from the test pattern memory unit 1, and reads out the test vectors of the selected test pattern file. The data processing unit 2 searches for the DC test point among the selected terminals by using the test vectors of the selected test pattern file and the input test point finding condition.

In the case of the VOH test, one of the selected output terminals of the circuit which is in accordance with the test point finding condition (the output voltage of the terminal should be at the logical "High" state) is found as the DC test point.

Step S11 detects whether at least one suitable DC test point among the selected terminals is found by the automatic search mode.

If the result at the step S11 is negative, step S12 is performed. The step S12 leaves the name of the selected test pattern file and the vector number of the special test vector for each of the terminals of the circuit in the displayed list blank.

If the result at the step S11 is affirmative, step S13 is performed. The step S13 inserts test point data of the DC test point into the displayed list, the test point data including the name of the selected test pattern file and the vector number of the special test vector of the selected test pattern file suitable for the DC test point. In addition, after the step S8 is performed, the step S13 is performed.

When the step S12 is performed, or when the step S13 is performed, step S14 is performed as indicated by the character "A" in FIG. 2B.

Referring to FIG. 2B, the step S14 detects whether a sorting instruction is input to the data processing unit 2 by the operator by using the input unit 5. The sorting instruction is to sort the input and output terminals of the list, displayed on the display unit 4, according to a specified key.

If the result at the step S14 is affirmative, step S15 is performed. The step S15 sorts the input and output terminals of the displayed list according to the specified key, and displays the resulting list in which the input and output terminals are sorted in alphanumeric or another order of the specified key. For example, the sorting of the terminals of the displayed list is performed by specifying the name of the selected test pattern file as a first key and specifying the vector number of the special test vector as a second key.

If the result at step S14 is negative, step S16 detects whether the finding of DC test points for all the selected terminals of the displayed list is completed. If the result at step S16 is affirmative, the DC test point finding procedures in FIGS. 2A and 2B end.

If the result at the step S16 is negative, the above steps S2 through S15 are repeated as indicated by the character "B" in FIG. 2A. When the displayed list at the step S16 includes at least one test point which is not yet found for the selected terminals (that is, the corresponding locations of the test pattern name and the vector number for the test point in the displayed list remain blank), the steps S2 through S15 are repeated.

Next, a description will be given of the operations of the DC test point finding method of the present embodiment when a selected test pattern file and a selected test point finding condition are input.

Herein, it is supposed that a test pattern file A, shown in TABLE 2 below, is one of the test pattern files stored in the memory unit 1, and the test pattern file A is selected by the operator. Also, it is supposed that the automatic search mode of the above system is selected by the operator, and DC test points related to the VOH test for selected terminals among the terminals of the circuit are searched by the above system in the automatic search mode.

TABLE 2

| TEST PATTERN FILE A | | | | |
|---|---|---|---|---|
| VECTOR NO. | PIN 1 | PIN 2 | PIN 3 | PIN 4 |
| 0 | X | X | X | X |
| 1 | X | L | X | X |
| 2 | L | L | X | X |
| 3 | L | H | X | X |

"L" indicates an expected value of DC characteristic of the terminal. When the output voltage is below a predetermined voltage VOL, the terminal is considered to be in logical "Low" state. "H" indicates an expected value of DC characteristic of the terminal. When the output voltage is above a predetermined voltage VOH, the terminal is considered to be in logical "High" state.

"X" indicates a "don't care" terminal. A DC characteristic of this terminal is not taken into account.

When the operator has information that the expected values of DC characteristics (the logical states) of the terminals PIN1 and PIN2 in the test pattern file A vary depending on the test vectors but the expected values of DC characteristics of the terminals PIN3 and PIN4 in the test pattern file A remain unchanged, the operator inputs data indicating selected terminals (PIN1 and PIN2) among the input and output terminals of the circuit to the data processing unit 2 by using the input unit 5. Thus, only the selected terminals PIN1 and PIN2 are subjected to the finding of the DC test point according to the selected test pattern file A by the data processing unit 2.

Since the terminals PIN3 and PIN4 become the non-selected terminals in the above case, the non-selected terminals PIN3 and PIN are not subjected to the finding of the DC test point according to the test pattern file A by the data processing unit 2.

After the finding of the DC test point for the selected terminals PIN1 and PIN2 in accordance with the test pattern file A is performed, the list in the above TABLE 1 is changed to the list in TABLE 3 below.

TABLE 3

| LIST | | |
|---|---|---|
| INPUT/OUTPUT TERMINALS | NAME OF TEST PATTERN | VECTOR NO. |
| PIN 1 PIN 2 PIN 3 PIN 4 | A | 3 |

In the present case, the DC test point related to the VOH test for the selected terminals PIN1 and PIN2 is found at the terminal PIN2 where the special test vector "3" of the selected test pattern file "A" meets the required DC characteristic of the VOH test. The required DC characteristic of the VOH test is that the logical "High" state of the output voltage is given at the terminal. As shown in the above TABLE 3, the name "A" of the selected test pattern file and the vector number "3" of the special test vector are indicated at the corresponding locations of the terminal PIN2 in the displayed list.

At the step S6, the selected terminals among the input and output terminals of the circuit are input to the data processing unit 2 by the operator. Thus, in the present embodiment, the finding of the DC test point for the selected terminals in accordance with the selected test pattern file is carried out. In the displayed list, not only the selected terminals PIN1 and PIN2 but also the non-selected terminals PIN3 and PIN4 are included. The non-selected terminals at the step S6 are different from the exclusion terminals which are input at the step S2. The exclusion terminals at the step S2 are omitted from the displayed list at the step S3.

Accordingly, the DC test point finding method of the present embodiment quickly and efficiently finds the DC test point of the integrated circuit. It is possible for the DC test point finding method to provide a flexibility of the finding of the DC test point for inputting selected terminals of the circuit.

Since the finding of the DC test point for the non-selected terminals PIN3 and PIN4 in accordance with the test pattern file A is not yet performed in the above-mentioned case, the steps S2 through S15 are performed again. At the step S6, the operator inputs data indicating selected terminals (PIN3 and PIN4) among the input and output terminals of the circuit, to the data processing unit 2 by using the input unit 5. At the step S9, the operator inputs a selected test pattern file B, which is shown in TABLE 4 below.

The test pattern file B is one of the test pattern files stored in the test pattern memory unit 1, and the test pattern file B is read from the test pattern memory unit 1 by the data processing unit 2. The data processing unit 2 performs the finding of the DC test point for the selected terminals PIN3 and PIN4 in accordance with the test pattern file B.

It is supposed that the operator has information that the expected values of DC characteristics of the terminals PIN3 and PIN4 in the test pattern file B vary depending on the test vectors but the expected values of DC characteristics of the terminals PIN1 and PIN2 in the test pattern file B remain unchanged.

After the finding of the DC test point for the selected terminals PIN3 and PIN4 in accordance with the test pattern file B is performed, the list in the above TABLE 3 is changed to the list in TABLE 5 below.

TABLE 4

| TEST PATTERN FILE B | | | | |
|---|---|---|---|---|
| VECTOR NO. | PIN 1 | PIN 2 | PIN 3 | PIN 4 |
| 0 | X | X | X | X |
| 1 | X | X | L | L |
| 2 | X | X | L | H |
| 3 | X | X | L | L |

TABLE 5

| LIST | | |
|---|---|---|
| INPUT/OUTPUT TERMINALS | NAME OF TEST PATTERN | VECTOR NO. |
| PIN 1 | | |
| PIN 2 | A | 3 |
| PIN 3 | | |
| PIN 4 | B | 2 |

In the present case, the DC test point related to the VOH test for the selected terminals PIN3 and PIN4 is found at the terminal PIN4 where the special test vector "2" of the selected test pattern file "B" meets the required DC characteristic of the VOH test. The required DC characteristic of the VOH test is that the logical "High" state of the output voltage is given at the terminal. As shown in the above TABLE 5, the name "B" of the selected test pattern file and the vector number "2" of the special test vector are indicated at the corresponding locations of the terminal PIN4 in the displayed list.

When it is needed to quickly check whether the test points for all the input and output terminals of the circuit are found, or when it is needed to quickly check whether the special vector numbers suitable for all the test points are found, the sorting instruction is input to the data processing unit 2 at the step S14 by the operator. At the step S15, the input and output terminals of the displayed list is sorted according to the specified key, and displays the resulting list in which the input and output terminals are sorted in alphanumeric or another order of the specified key.

In the present case, the sorting of the terminals of the displayed list is performed by specifying the name of the selected test pattern file as the first key and specifying the vector number of the special test vector as the second key. Therefore, the list in the above TABLE 5 is changed to the list in TABLE 6 below.

TABLE 6

| LIST | | |
|---|---|---|
| INPUT/OUTPUT TERMINALS | NAME OF TEST PATTERN | VECTOR NO. |
| PIN 1 | | |
| PIN 3 | | |
| PIN 2 | A | 3 |
| PIN 4 | B | 2 |

From the above TABLE 6, the operator clearly observes that the test points for the terminals PIN1 and PIN3 of the circuit are not yet found by the DC test point finding system in the automatic search mode.

In the DC test point finding method of the present embodiment, it is possible for the operator to select the manual search mode. At the step S8, the operator is allowed to manually input specific test point data of the terminals PIN1 and PIN3 into the displayed list by using the input unit 5. The specific test point data is, for example, a vector number of a special test vector suitable for the test point.

Further, it is supposed that the terminal PIN3 in the above TABLE 6 is the exclusion terminal which should be excluded from the input and output terminals of the circuit subjected to the finding of the DC test point. At the step S3, the operator is allowed to input data indicating the exclusion terminal PIN3, to the data processing unit 2 by using the input unit 5. The exclusion terminal PIN3 is omitted by the data processing unit 2 from the displayed list in the above TABLE 6.

Therefore, in the present case, the list in the above TABLE 6 is changed to the list in TABLE 7 below.

TABLE 7

| LIST | | |
|---|---|---|
| INPUT/OUTPUT TERMINALS | NAME OF TEST PATTERN | VECTOR NO. |
| PIN 1 | | |
| PIN 2 | A | 3 |
| PIN 4 | B | 2 |

In the list in the above TABLE 7, only the exclusion terminal PIN3 is omitted from the list in the above TABLE 6. Further, in the DC test point finding method of the present embodiment, it is possible for the operator to reenter the omitted exclusion terminals to the displayed list. At the step S5, the operator is allowed to input a selected exclusion terminal among the omitted exclusion terminals, and the selected exclusion terminals is reentered to the displayed list by the data processing unit 2.

As described above, in the DC test point finding method of the present embodiment, the test point data indicating the test points for the input and output terminals of the circuit is included in the displayed list. From the displayed list, the operator can easily observe the contents of the test points which are found as well as the contents of the terminals for which the test points are found. Therefore, the DC test point finding method of the present invention can quickly and efficiently find the DC test points of the circuit.

In the DC test point finding method of the present embodiment, the finding of the test point for the selected terminals PIN1 and PIN2 in accordance with the selected test pattern file A can be performed and the finding of the test point for the selected terminals PIN3 and PIN4 in accordance with the selected test pattern file B can be performed. Therefore, it is possible for the DC test point finding method of the present embodiment to provide a flexibility of the finding of the DC test points for inputting selected terminals of the circuit.

In the DC test point finding method of the present embodiment, the operator is allowed to input a selected test pattern file among the test pattern files stored in the memory unit 1. Therefore, it is possible for the DC test point finding method of the present embodiment to provide a flexibility of the finding of the DC test points for applying different test patterns to the selected terminals of the circuit.

In the DC test point finding method of the present embodiment, the operator is allowed to input a sorting instruction to sort the terminals of the displayed list according to a specified key. Therefore, the operator can easily observe the terminals for which the test points are not yet found by the DC test point finding system in the automatic search mode.

In the DC test point finding method of the present embodiment, the operator can easily observe the result of the finding after the finding of the DC test point for each terminal included in the displayed list is done.

Further, it is possible for the DC test point finding method of the present invention to provide a capability of omitting the exclusion terminals which should be excluded from the terminals which are tested for a specific test item such as the VOH test.

What is claimed is:

1. A method of finding a DC test point of an integrated circuit to be used during testing of the integrated circuit, said circuit including a plurality of input and output terminals identified by respective terminal names, comprising steps of:

displaying a list of all the input and output terminals of said circuit, said list including the respective terminal names of all the input and output terminals;

inputting selected terminals among the input and output terminals of the displayed list;

inputting a selected test pattern file among a number of stored test pattern files, each stored test pattern file including a plurality of sequentially occurred test vectors and identified by a name of the test pattern file, and said test vectors identified by respective vector numbers;

inputting a test point finding condition related to the DC test point, the test point finding condition indicating a desired state of an output terminal for a given test vector;

finding the DC test point of said circuit for the selected terminals by using the test vectors of the selected test pattern file and the test point finding condition; and inserting test point data of said found DC test point into the displayed list so that the resulting list including said test point data is displayed.

2. The method according to claim 1, wherein said method further comprises steps of:

inputting exclusion terminals among the input and output terminals of said circuit when said exclusion terminals are selected by an operator, said exclusion terminals being excluded from the terminals which are subjected to said finding step; and omitting said exclusion terminals from the displayed list, so that only the remaining terminals of the displayed list are subjected to said finding step.

3. The method according to claim 2, wherein said method further comprises steps of:

inputting a selected exclusion terminal among the omitted exclusion terminals when a reentry of the selected exclusion terminal to the displayed list is requested; and displaying the resulting list to which the selected exclusion terminal is reentered.

4. The method according to claim 1, wherein said method further comprises steps of:

inputting specific data of a DC test point into the displayed list when a manual search mode is selected; and displaying the resulting list including said specific data of the DC test point.

5. The method according to claim 1, wherein said method further comprises steps of:

sorting the terminals included in the displayed list according to a specified key when a sorting instruction is input; and displaying the resulting list in which the terminals are sorted according to the specified key.

6. The method according to claim 5, wherein said sorting of said terminals is performed in accordance with one of a name of the selected test pattern file and a vector number of a special test vector of the selected test pattern file.

7. The method according to claim 1, wherein said test point data includes a name of the selected test pattern file and a vector number of a special test vector of the selected test pattern file suitable for said DC test point.

8. The method according to claim 1, wherein said method further comprises a step of detecting whether finding of DC test points for all the input and output terminals of the circuit is completed, so that at least said finding and said inserting steps are repeated when the finding of all the DC test points is not completed.

* * * * *